United States Patent
Chuang et al.

(10) Patent No.: US 12,407,348 B2
(45) Date of Patent: Sep. 2, 2025

(54) TOUCH DETECTION CIRCUIT AND OPERATION DEVICE

(71) Applicant: Nuvoton Technology Corporation, Hsinchu Science Park (TW)

(72) Inventors: Fu-Chiang Chuang, Hsinchu (TW); Chieh-Sheng Tu, Hsinchu Science Park (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 137 days.

(21) Appl. No.: 18/321,184

(22) Filed: May 22, 2023

(65) Prior Publication Data

US 2024/0106433 A1     Mar. 28, 2024

(30) Foreign Application Priority Data

Sep. 28, 2022   (TW) .................................. 111136663

(51) Int. Cl.
| | | |
|---|---|---|
| *H03K 17/00* | (2006.01) | |
| *G06F 3/023* | (2006.01) | |
| *G06F 3/044* | (2006.01) | |
| *H03K 17/96* | (2006.01) | |

(52) U.S. Cl.
CPC ........... *H03K 17/962* (2013.01); *G06F 3/023* (2013.01); *G06F 3/044* (2013.01)

(58) Field of Classification Search
CPC ...... G06F 3/0354; G06F 3/044; G06F 3/0441; G06F 3/0442; G06F 3/0445; G06F 3/041; H03K 17/962

See application file for complete search history.

(56) References Cited

U.S. PATENT DOCUMENTS

| | | | | |
|---|---|---|---|---|
| 10,770,024 | B2 * | 9/2020 | Ahn ..................... | G09G 3/3696 |
| 2011/0011717 | A1 * | 1/2011 | Lin ...................... | H03K 17/962 |
| | | | | 200/600 |
| 2013/0278509 | A1 * | 10/2013 | Chang ................. | G06F 3/04166 |
| | | | | 345/173 |
| 2013/0342496 | A1 * | 12/2013 | Tsai .................... | G06F 3/04182 |
| | | | | 345/174 |

(Continued)

FOREIGN PATENT DOCUMENTS

| | | |
|---|---|---|
| CN | 103513834 A | 1/2014 |
| CN | 111258442 A | 6/2020 |

(Continued)

OTHER PUBLICATIONS

An Office Action in corresponding TW Application No. 111136663 dated May 29, 2023 is attached, 6 pages.

*Primary Examiner* — Tuan T Lam
(74) *Attorney, Agent, or Firm* — MUNCY, GEISSLER, OLDS & LOWE, P.C.

(57) ABSTRACT

A touch detection circuit detects whether a key is being touched and includes a comparator, a compensation capacitor, and a voltage control circuit. The comparator includes an inverting input, a non-inverting input, and an output terminal. The compensation capacitor is coupled to the inverting input. The voltage control circuit provides an output voltage to the non-inverting input. In a calibration mode, the voltage control circuit adjusts the output voltage according to the voltage level of the output terminal.

20 Claims, 3 Drawing Sheets

(56) References Cited

U.S. PATENT DOCUMENTS

| | | | |
|---|---|---|---|
| 2016/0070294 A1* | 3/2016 | Chung | G09G 5/12 |
| | | | 331/8 |
| 2016/0188007 A1 | 6/2016 | Jung et al. | |
| 2018/0292923 A1* | 10/2018 | Peretz | G06F 3/041 |
| 2020/0210046 A1* | 7/2020 | Lee | G06F 3/0445 |
| 2021/0286462 A1* | 9/2021 | Wu | H03K 17/962 |
| 2023/0384885 A1* | 11/2023 | Kim | G06F 3/04164 |

FOREIGN PATENT DOCUMENTS

| | | |
|---|---|---|
| TW | 201102897 A1 | 1/2011 |
| TW | 201539259 A | 10/2015 |

* cited by examiner

TOUCH DETECTION CIRCUIT AND OPERATION DEVICE

CROSS REFERENCE TO RELATED APPLICATIONS

This application claims priority of Taiwan Patent Application No. 111136663, filed on Sep. 28, 2022, the entirety of which is incorporated by reference herein.

BACKGROUND OF THE INVENTION

Field of the Invention

The present invention relates to a detection circuit, and, in particular, to a detection circuit that determines whether a key is being touched.

Description of the Related Art

With technological development, the types and functions of electronic devices have increased. Most electronic devices have an input interface that allows users to input information. Common input interfaces comprise keys and a mouse. When a key is touched, the electronic device performs a corresponding operation. However, the metal pad in the key can easily be disturbed by high-frequency signals, which can lead to the electronic devices misjudging when a key or button is being touched.

BRIEF SUMMARY OF THE INVENTION

In accordance with an embodiment of the disclosure, a touch detection circuit detects whether a key is being touched and comprises a comparator, a compensation capacitor, and a voltage control circuit. The comparator comprises an inverting input, a non-inverting input, and an output terminal. The compensation capacitor is coupled to the inverting input. The voltage control circuit provides an output voltage to the non-inverting input. In a calibration mode, the voltage control circuit adjusts the output voltage according to the voltage level of the output terminal.

In accordance with another embodiment of the disclosure, an operation device comprises a key and a touch detection circuit. The touch detection circuit is configured to determine whether the key is being touched and comprises a comparator, a compensation capacitor, and a voltage control circuit. The comparator comprises an inverting input, a non-inverting input, and an output terminal. The compensation capacitor is coupled to the inverting input. The voltage control circuit provides an output voltage to the non-inverting input. In a calibration mode, the voltage control circuit adjusts the output voltage according to the voltage level of the output terminal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
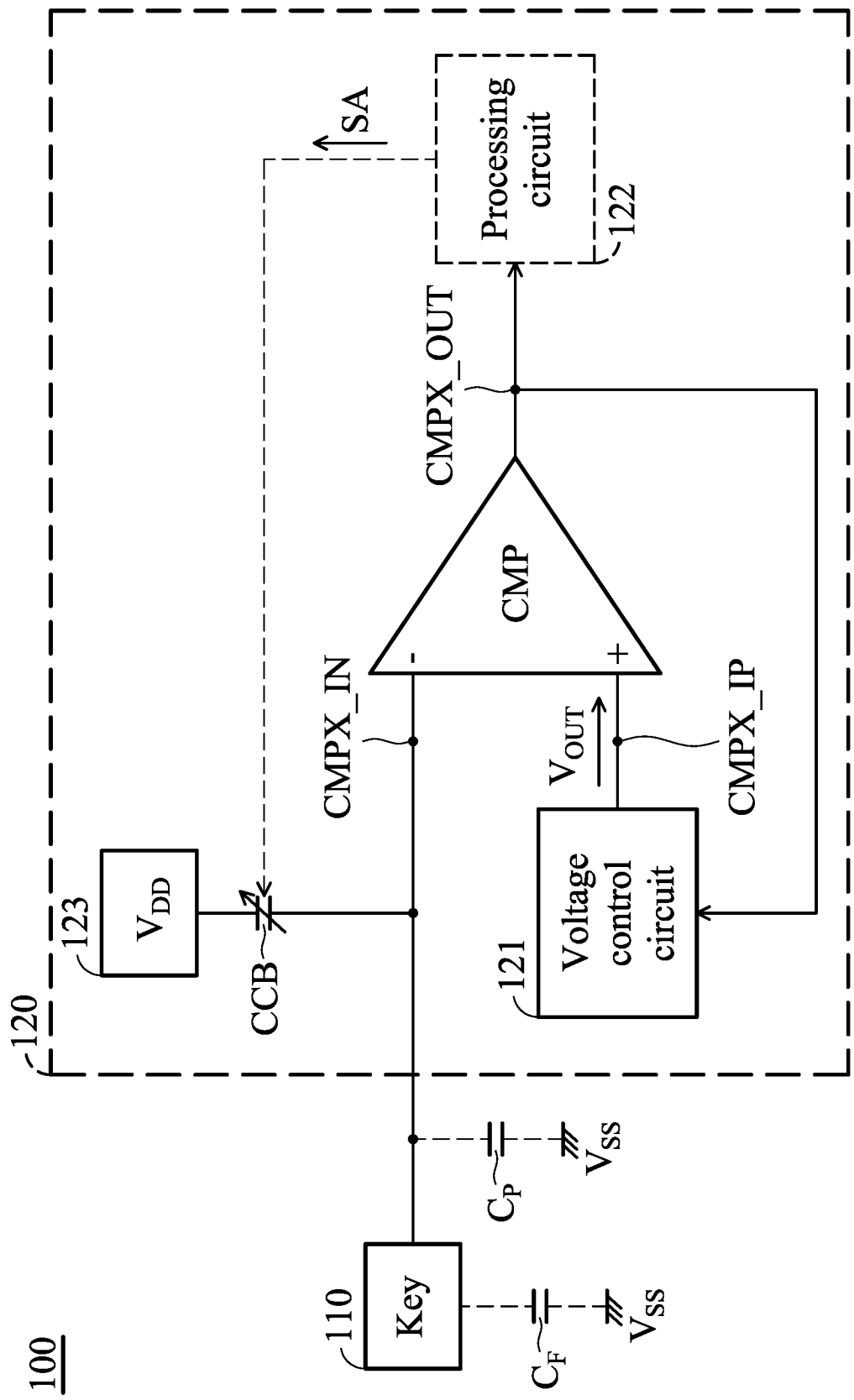
FIG. 1 is a schematic diagram of an exemplary embodiment of an operation device according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operation device according to various aspects of the present disclosure. The operation device 100 comprises a key 110 and a touch detection circuit 120. The touch detection circuit 120 is configured to determine whether the key 110 is being touched. The kind of key 110 is not limited in the present disclosure. In one embodiment, the key 110 is a capacitive touch key. In FIG. 1, the capacitor $C_P$ indicates the parasitic capacitor of the key 110. The capacitor C F indicates an additional touch capacitor generated when the key 110 is touched. In some embodiment, the capacitor $C_P$ is generated by the electric field between the key 110 and other conductors, such as a ground layer, traces, product mechanisms, or any metals in the housing. The number of keys is not limited in the present disclosure. In other embodiments, the operation device 100 comprises more keys. In cases such as this, each key corresponds to a touch detection circuit or at least two keys share the same touch detection circuit.

The touch detection circuit 120 comprises a comparator CMP, a compensation capacitor CCB and a voltage control circuit 121. As shown in FIG. 1, the comparator CMP comprises an inverting input CMPX_IN, an non-inverting input CMPX_IP, and an output terminal CMPX_OUT. The compensation capacitor CCB is coupled to the inverting input CMPX_IN. In this embodiment, the compensation capacitor CCB is a variable capacitor. The voltage control circuit 121 provides an output voltage $V_{OUT}$ to the non-inverting input CMPX_IP to control the voltage level of the output terminal CMPX_OUT.

In a calibration mode, the voltage control circuit 121 adjusts the output voltage $V_{OUT}$ according to the voltage level of the output terminal CMPX_OUT. For example, when the voltage level of the output terminal CMPX_OUT is equal to the first specific level (e.g., a high level), the voltage control circuit 121 reduces the output voltage $V_{OUT}$. After reducing the output voltage \Tom', the voltage control circuit 121 detects the voltage level of the output terminal CMPX_OUT. When the voltage level of the output terminal CMPX_OUT is still equal to the first specific level, the voltage control circuit 121 re-reduces the output voltage \Tour until the voltage level of the output terminal CMPX_OUT is not equal to the first specific level. When the voltage level of the output terminal CMPX_OUT is not equal to the first specific level, the voltage control circuit 121 stops adjusting the output voltage \Tom' and fixes the output voltage \Tour. At this time, the voltage of the non-inverting input CMPX_IP (i.e., the output voltage $V_{OUT}$) is lower than the voltage of the inverting input CMPX_IN.

Therefore, the voltage level of the output terminal CMPX_OUT is maintained to the second specific level (e.g., a lower level).

Since the voltage level of the output terminal CMPX_OUT is maintained to the second specific level, the touch detection circuit 120 is capable of determining whether the key 110 is being touched according to the voltage level of the output terminal CMPX_OUT in an operation mode. For example, in an operation mode, when the key 110 is not touched, the voltage of the non-inverting input CMPX_IP is lower than the voltage of the inverting input CMPX_IN. Therefore, the voltage level of the output terminal CMPX_OUT is maintained to the second specific level. However, when the key 110 is being touched, the touch capacitor C F is connected to the parasitic capacitor $C_P$ in parallel. At this time, the voltage of the inverting input CMPX_IN is reduced. When the voltage of the inverting input CMPX_IN is lower than the voltage of the non-inverting input CMPX_IP, the voltage level of the output terminal CMPX_OUT is not equal to the second specific level. Therefore, in the operation mode, the touch detection circuit 120 determines that the key 110 is being touched according to the voltage level of the output terminal CMPX_OUT.

In some embodiments, the touch detection circuit 120 further comprises a processing circuit 122. The processing circuit 122 sends an adjustment signal SA to adjust the capacitance of the compensation capacitor CCB. The present disclosure does not limit how the processing circuit 122 adjusts the capacitance of the compensation capacitor CCB. In one embodiment, the adjustment signal SA is a digital value. The range of the digital value is 0-255. When the adjustment signal SA is different digital values, the compensation capacitor CCB has different capacitance values. For example, when the value of the adjustment signal SA is 255, the capacitance of the compensation capacitor CCB has reached the upper limit, such as 4 pF. In other embodiments, before the processing circuit 122 adjusts the capacitance of the compensation capacitor CCB, the value of the adjustment signal SA is the initial value, such as 130. In the operation mode, the processing circuit 122 adjusts the capacitance of the compensation capacitor CCB according to the voltage level of the output terminal CMPX_OUT. For example, when the voltage level of the output terminal CMPX_OUT is not equal to the second specific level, it means that the key 110 is being touched. Therefore, the processing circuit 122 adjusts the capacitance of the compensation capacitor CCB to adjust the voltage of the inverting input CMPX_IN. In one embodiment, with increase of the capacitance of the compensation capacitor CCB, the voltage of the inverting input CMPX_IN is increased.

When the voltage of the inverting input CMPX_IN is greater than the voltage of the non-inverting input CMPX_IP, the voltage level of the output terminal CMPX_OUT is equal to the second specific level, such as a lower level. The processing circuit 122 stops adjusting the compensation capacitor CCB. In one embodiment, the processing circuit 122 determines whether the variation of the capacitance of the compensation capacitor CCB has reached the threshold value. When the variation of the capacitance of the compensation capacitor CCB has not reached the threshold value, it means that the touch capacitor C F is caused by noise. However, when the variation of the capacitance of the compensation capacitor CCB reaches the threshold value, it means that the key 110 is indeed being touched. Therefore, the processing circuit 122 performs a corresponding operation. In one embodiment, the processing circuit 122 comprises a counter to count the duration of the output terminal CMPX_OUT being at a high level.

In some embodiments, when the operation device 100 is powered on, the touch detection circuit 120 enters a calibration mode to ensure that the output terminal CMPX_OUT of the comparator CMP is maintained at a low level. Then, the touch detection circuit 120 enters an operation mode to determine whether the key 110 is being touched. In other embodiments, in the operation mode, the touch detection circuit 120 enters the calibration mode at regular time intervals. After the touch detection circuit 120 confirms that the output terminal CMPX_OUT of the comparator CMP is maintained at the low level, the touch detection circuit 120 re-enters the operation.

In other embodiments, the compensation capacitor CCB receives the operation voltage $V_{DD}$. In cases such as this, the operation voltage $V_{DD}$ is provided by a power source 123. The compensation capacitor CCB is connected to the parasitic capacitor $C_P$ in parallel between the operation voltages $V_{DD}$ and $V_{SS}$. When the key 110 is not touched, the capacitance of the compensation capacitor CCB and the parasitic capacitor $C_P$ divide the operation voltage $V_{DD}$. At this time, the voltage of the inverting input CMPX_IN is greater than the voltage of the non-inverting input CMPX_IP. When the key 110 is touched, the touch capacitor C F is connected to the parasitic capacitor $C_P$ in parallel. Since the compensation capacitor CCB, the touch capacitor C F, and the parasitic capacitor $C_P$ divide the operation voltage $V_{DD}$, the voltage of the inverting input CMPX_IN is reduced.

Figure 2:
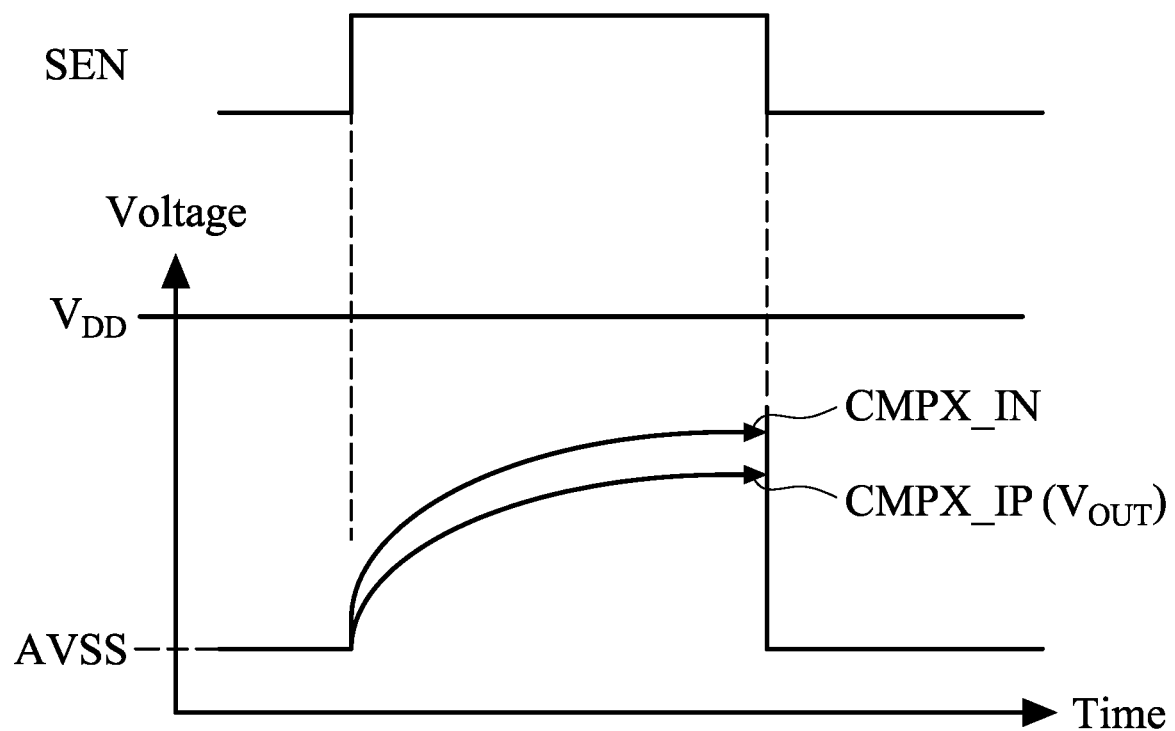
FIG. 2 is a schematic diagram of an exemplary embodiment of a touch detection circuit according to various aspects of the present disclosure.

FIG. 2 is a schematic diagram of an exemplary embodiment of the touch detection circuit according to various aspects of the present disclosure. When a scan signal SEN is at a low level, the voltages of the inverting input CMPX_IN and the non-inverting input CMPX_IP are equal to the operation voltage AVSS. When the scan signal SEN is changed from the low level to a high level, the touch detection circuit 120 determines whether the key 110 is being touched. When the key 110 is not being touched, the voltage of the inverting input CMPX_IN is greater than the voltage of the non-inverting input CMPX_IP. When the scan signal SEN is changed from the high level to the low level, the voltages of the inverting input CMPX_IN and the non-inverting input CMPX_IP are equal to the operation voltage AVSS. In one embodiment, the operation voltage $V_{DD}$ is fixed at a high voltage.

Figure 3:
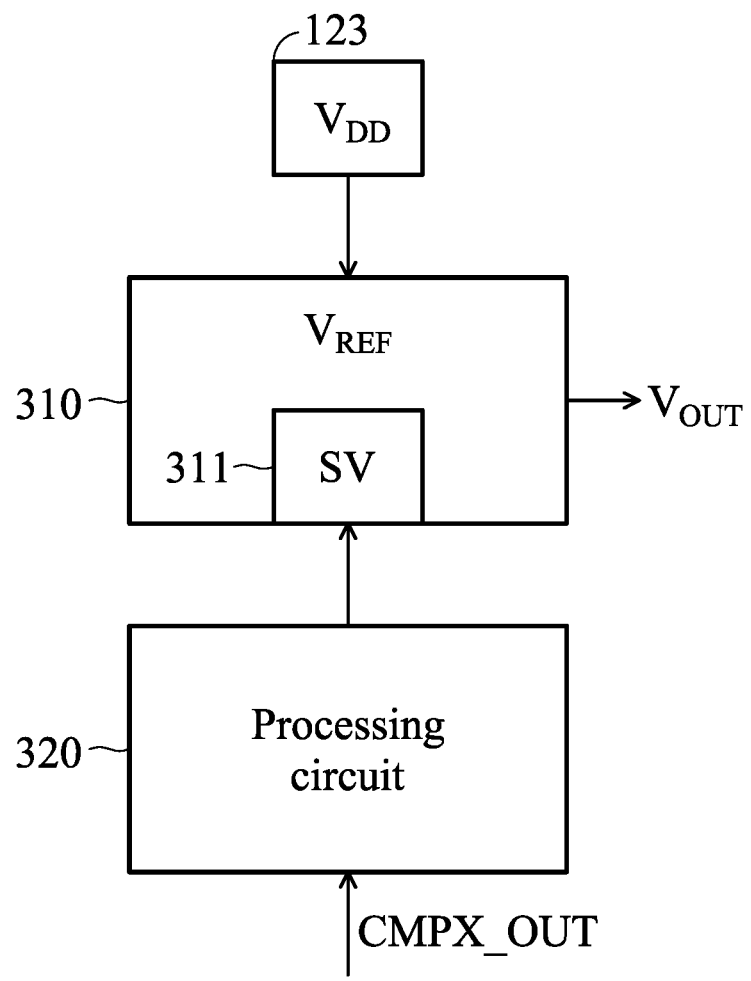
FIG. 3 is a schematic diagram of an exemplary embodiment of a voltage control circuit according to various aspects of the present disclosure.

FIG. 3 is a schematic diagram of an exemplary embodiment of the voltage control circuit 121 according to various aspects of the present disclosure. The voltage control circuit 121 comprises a digital-to-analog converter (DAC) 310 and a processing circuit 320. The DAC 310 generates the output voltage $V_{OUT}$ according to the set value SV. In one embodiment, the DAC 310 comprises a control register 311. The control register 311 is configured to store the set value SV. In some embodiment, the DAC 310 is coupled to the power source 123 to receive the operation voltage $V_{DD}$. In cases such as this, the operation voltage $V_{DD}$ is provided as a reference voltage $V_{REF}$. The output voltage $V_{OUT}$ is in $0 \sim V_{REF}$. In other words, the output voltage $V_{OUT}$ is less than or equal to the reference voltage $V_{REF}$.

The processing circuit 320 adjusts the set value SV stored in the control register 311 according to the voltage level of the output terminal CMPX_OUT. In one embodiment, the processing circuit 320 comprises a register (not shown) to store firmware. The processing circuit 320 executes the firmware to write a corresponding set value SV into the control register 311. In the calibration mode, the processing circuit 320 detects the voltage level of the output terminal CMPX_OUT. When the voltage level of the output terminal CMPX_OUT is equal to the first specific level (e.g., a high level), the processing circuit 320 gradually reduces or increases the set value SV. When this happens, the DAC 310 generates different output voltages $V_{OUT}$ according to different set values SV.

In some embodiments, the key 110 is easily interfered by high-frequency signals. Therefore, before the touch detection circuit 120 determines whether the key 110 is being touched, the touch detection circuit 120 first performs a calibration operation to set the voltage level of the output terminal CMPX_OUT of the comparator CMP being at a low level. In this embodiment, since the output voltage $V_{OUT}$ covers a wide range, it can ensure that the voltage level of the output terminal CMPX_OUT of the comparator CMP is a low level when the key is not touched. Additionally, the voltage control circuit 121 is used to calibrate the voltage level of the output terminal CMPX_OUT, the non-inverting input CMPX_IP does not need to receive an external calibration signal.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch detection circuit for detecting whether a key is being touched, comprising:
   a comparator comprising an inverting input, a non-inverting input, and an output terminal;
   a compensation capacitor coupled to the inverting input;
   a first processing circuit adjusting the capacitance of the compensation capacitor according to a voltage level of the output terminal; and
   a voltage control circuit providing an output voltage to the non-inverting input,
   wherein in a calibration mode, the voltage control circuit adjusts the output voltage according to the voltage level of the output terminal.

2. The touch detection circuit as claimed in claim 1, wherein in the calibration mode and in response to the voltage level of the output terminal being equal to a first specific level, the voltage control circuit reduces the output voltage until the voltage level of the output terminal is not equal to the first specific level.

3. The touch detection circuit as claimed in claim 1, wherein the voltage control circuit comprises:
   a digital-to-analog converter generating the output voltage according to a set value; and
   a second processing circuit adjusting the set value according to the voltage level of the output terminal.

4. The touch detection circuit as claimed in claim 3, wherein the digital-to-analog converter comprises:
   a control register configured to store the set value.

5. The touch detection circuit as claimed in claim 3, further comprising:
   a power source configured to provide an operation voltage to the compensation capacitor and the digital-to-analog converter.

6. The touch detection circuit as claimed in claim 5, wherein the maximum level of the output voltage is equal to the operation voltage.

7. The touch detection circuit as claimed in claim 1, wherein in an operation mode, the voltage control circuit stops adjusting the output voltage.

8. The touch detection circuit as claimed in claim 7, wherein in the operation mode and in response to the voltage level of the output terminal not being equal to a second specific level, the first processing circuit increases the capacitance of the compensation capacitor until the voltage level of the output terminal is equal to the second specific level.

9. The touch detection circuit as claimed in claim 8, wherein:
   the first processing circuit determines whether a variation of the capacitance of the compensation capacitor has reached a threshold value, and
   in response to the variation of the capacitance of the compensation capacitor reaching the threshold value, it is determined that the key is being touched.

10. The touch detection circuit as claimed in claim 1, wherein:
    in response to the key not being touched, a voltage of the inverting input is higher than a voltage of the non-inverting input, and
    in response to the key being touched, the voltage of the inverting input is lower than the voltage of the non-inverting input.

11. An operation device comprising:
    a key; and
    a touch detection circuit configured to determine whether the key is being touched and comprising:
      a comparator comprising an inverting input, a non-inverting input, and an output terminal;
      a compensation capacitor coupled to the inverting input;
      a first processing circuit adjusting the capacitance of the compensation capacitor according to a voltage level of the output terminal; and
      a voltage control circuit providing an output voltage to the non-inverting input,
    wherein in a calibration mode, the voltage control circuit adjusts the output voltage according to the voltage level of the output terminal.

12. The operation device as claimed in claim 11, wherein in the calibration mode and in response to the voltage level of the output terminal being equal to a first specific level, the voltage control circuit reduces the output voltage until the voltage level of the output terminal is not equal to the first specific level.

13. The operation device as claimed in claim 11, wherein the voltage control circuit comprises:
    a digital-to-analog converter generating the output voltage according to a set value; and
    a second processing circuit adjusting the set value according to the voltage level of the output terminal.

14. The operation device as claimed in claim 13, wherein the digital-to-analog converter comprises:
a control register configured to store the set value.

15. The operation device as claimed in claim 13, further comprising:
a power source configured to provide an operation voltage to the compensation capacitor and the digital-to-analog converter.

16. The operation device as claimed in claim 15, wherein the maximum level of the output voltage is equal to the operation voltage.

17. The operation device as claimed in claim 11, wherein in an operation mode, the voltage control circuit stops adjusting the output voltage.

18. The operation device as claimed in claim 17, wherein in the operation mode and in response to the voltage level of the output terminal not being equal to a second specific level, the first processing circuit increases the capacitance of the compensation capacitor until the voltage level of the output terminal is equal to the second specific level.

19. The operation device as claimed in claim 18, wherein:
the first processing circuit determines whether a variation of the capacitance of the compensation capacitor has reached the threshold value, and
in response to the variation of the capacitance of the compensation capacitor reaching the threshold value, it is determined that the key is being touched.

20. The operation device as claimed in claim 11, wherein:
in response to the key not being touched, a voltage of the inverting input is higher than a voltage of the non-inverting input, and
in response to the key being touched, the voltage of the inverting input is lower than the voltage of the non-inverting input.

* * * * *